(12) United States Patent
Song

(10) Patent No.: US 12,243,720 B2
(45) Date of Patent: Mar. 4, 2025

(54) GAS SUPPLY BLOCK AND SUBSTRATE-PROCESSING APPARATUS INCLUDING THE SAME

(71) Applicant: WONIK IPS CO., LTD., Pyeongtaek-si (KR)

(72) Inventor: Byoung Ho Song, Suwon-si (KR)

(73) Assignee: WONIK IPS CO., LTD, Pyeongtaek-si (KR)

(*) Notice: Subject to any disclaimer, the term of this patent is extended or adjusted under 35 U.S.C. 154(b) by 697 days.

(21) Appl. No.: 17/517,068

(22) Filed: Nov. 2, 2021

(65) Prior Publication Data

US 2022/0165548 A1    May 26, 2022

(30) Foreign Application Priority Data

Nov. 24, 2020 (KR) .................. 10-2020-0158741

(51) Int. Cl.
*H01J 37/32* (2006.01)
*C23C 16/455* (2006.01)

(52) U.S. Cl.
CPC ...... *H01J 37/32449* (2013.01); *C23C 16/455* (2013.01); *H01J 37/3244* (2013.01); *H01J 37/32715* (2013.01)

(58) Field of Classification Search
CPC ............. H01J 37/32899; H01J 37/3244; H01J 37/32908; H01J 37/32449; H01J 37/32889; C23C 16/455
See application file for complete search history.

(56) References Cited

U.S. PATENT DOCUMENTS

| | | | |
|---|---|---|---|
| 2003/0213560 A1* | 11/2003 | Wang | H01L 21/67196 156/345.31 |
| 2009/0169744 A1* | 7/2009 | Byun | C23C 16/45578 118/724 |
| 2016/0168705 A1 | 6/2016 | Lind | |

(Continued)

FOREIGN PATENT DOCUMENTS

| | | | | |
|---|---|---|---|---|
| KR | 1020110114416 A | | 10/2011 | |
| KR | 20120009596 A | * | 2/2012 | ....... C23C 16/45574 |
| KR | 1020140023934 | | 2/2014 | |

(Continued)

OTHER PUBLICATIONS

English Machine Translation of Lee et al. (KR20120009596A) retrieved from PE2E Search Fit database on Jul. 18, 2024. (Year: 2024).*

(Continued)

*Primary Examiner* — Ram N Kackar
*Assistant Examiner* — Laureen Chan
(74) *Attorney, Agent, or Firm* — William Park & Associates Ltd.

(57) ABSTRACT

A gas supply block may include a first block, a second block and a third block. The first block may include a first gas inlet passage configured to supply a first process gas. The second block may include a second gas inlet passage configured to supply a second process gas. The third block may be combined with the first block and the second block. The third block may be configured to diffuse and supply the first process gas and the second process gas into gas supply lines connected to the processing spaces.

27 Claims, 6 Drawing Sheets

(56) References Cited

U.S. PATENT DOCUMENTS

2019/0256976 A1* 8/2019 Kabe ................. C23C 16/45561
2023/0377908 A1* 11/2023 Bamford ........... C23C 16/45561

FOREIGN PATENT DOCUMENTS

| KR | 1020160098538 A | 8/2016 |
| KR | 1020170127391 A | 11/2017 |
| WO | WO-2018083989 A1 * | 5/2018 |

OTHER PUBLICATIONS

English Machine Translation of Fujibayashi et al. (WO2018083989A1) retrieved from Espacenet on Jul. 24, 2024 (Year: 2024).*

* cited by examiner

GAS SUPPLY BLOCK AND SUBSTRATE-PROCESSING APPARATUS INCLUDING THE SAME

CROSS-REFERENCES TO RELATED APPLICATION

The present application claims priority under 35 U.S.C. § 119(a) to Korean application number 10-2020-0158741, filed on Nov. 24, 2020, in the Korean Intellectual Property Office, which is incorporated herein by reference in its entirety.

BACKGROUND

1. Technical Field

Various embodiments may generally relate to a substrate-processing apparatus, more particularly, to a gas supply block and a substrate-processing apparatus including the gas supply block.

2. Related Art

In order to meet a productivity, process uniformity, etc., in a substrate-processing apparatus, a plurality of substrates may be simultaneously processed in one process chamber. For example, the substrate-processing apparatus may include a process chamber having a plurality of processing spaces configured to process the substrates, a plurality of gas injectors arranged at an upper portion of the process chamber to inject a process gas into the processing spaces, and a plurality of substrate supports arranged in the process chamber corresponding to the gas injectors to support the substrates. Further, the substrate-processing apparatus may include a gas supplying member configured to supply the process gas to the gas injectors, and a gas branching member configured to branch the process gas supplied from the gas supplying member into the gas injectors.

The gas injector and the gas branching member may be connected with each other through one gas supply line. Further, each of the gas branching member and the gas injectors may be connected with each other through one gas branch line.

However, when the substrate-processing apparatus may be configured to form a composite layer, different kinds of the process gases may be alternately supplied through one gas supply line. Thus, the gas supply line may not be fully purged to increase a generation of particles. This may cause bad line edge roughness.

Further, a first process gas for forming a first layer and a second process gas for forming a second layer may be alternately supplied through one gas supply line. Thus, a purge time for removing the process gas in the gas supply line before supplying the second process gas after supplying the first process gas and before supplying the first process gas after supplying the second process gas may be increased.

SUMMARY

In example embodiments, a gas supply block may be configured to supply a process gas into a chamber having a plurality of processing spaces. The gas supply block may include a lower block and an upper block. The lower block may include a plurality of first gas supply passages and a first gas inlet passage. The first gas supply passages may be configured to supply a first process gas into each of the processing spaces. The first gas inlet passage may be configured to introduce the first process gas into the first gas supply passages. The upper block may be combined with the lower block. The upper block may include a plurality of second gas supply passages and a second gas inlet passage. The second gas supply passages may be configured to supply a second process gas different from the first process gas into the processing spaces. The second gas inlet passage may be configured to introduce the second process gas into the second gas supply passages.

In example embodiments, a substrate-processing apparatus may include a chamber, a plurality of substrate supports, a plurality of gas injectors and a gas supply block. The chamber may include a plurality of processing spaces. The substrate supports may be arranged in the processing spaces of the chamber. The gas injectors may be arranged in the processing spaces to correspond to the substrate supports. The gas supply block may be configured to alternately supply a first process gas and a second process gas different from the first process gas into the gas injectors. The gas supply block may include a lower block and an upper block. The lower block may include a plurality of first gas supply passages and a first gas inlet passage. The first gas supply passages may be configured to supply the first process gas into each of the processing spaces. The first gas inlet passage may be configured to introduce the first process gas into the first gas supply passages. The upper block may be combined with the lower block. The upper block may include a plurality of second gas supply passages and a second gas inlet passage. The second gas supply passages may be configured to supply the second process gas different from the first process gas into the processing spaces. The second gas inlet passage may be configured to introduce the second process gas into the second gas supply passages.

In example embodiments, a gas supply block may be configured to supply a process gas into a chamber having a plurality of processing spaces. The gas supply block may include a first block, a second block and a third block. The first block may include a first gas inlet passage configured to supply a first process gas. The second block may include a second gas inlet passage configured to supply a second process gas. The third block may be combined with the first block and the second block. The third block may be configured to diffuse and supply the first process gas and the second process gas into gas supply lines connected to the processing spaces.

BRIEF DESCRIPTION OF THE DRAWINGS

The above and another aspects, features and advantages of the subject matter of the present disclosure will be more clearly understood from the following detailed description taken in conjunction with the accompanying drawings, in which.

DETAILED DESCRIPTION

Various embodiments of the present invention will be described in greater detail with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present invention as defined in the appended claims.

The present invention is described herein with reference to cross-section and/or plan illustrations of idealized embodiments of the present invention. However, embodiments of the present invention should not be construed as limiting the inventive concept. Although a few embodiments of the present invention will be shown and described, it will be appreciated by those of ordinary skill in the art that changes may be made in these embodiments without departing from the principles and spirit of the present invention.

Figure 1:
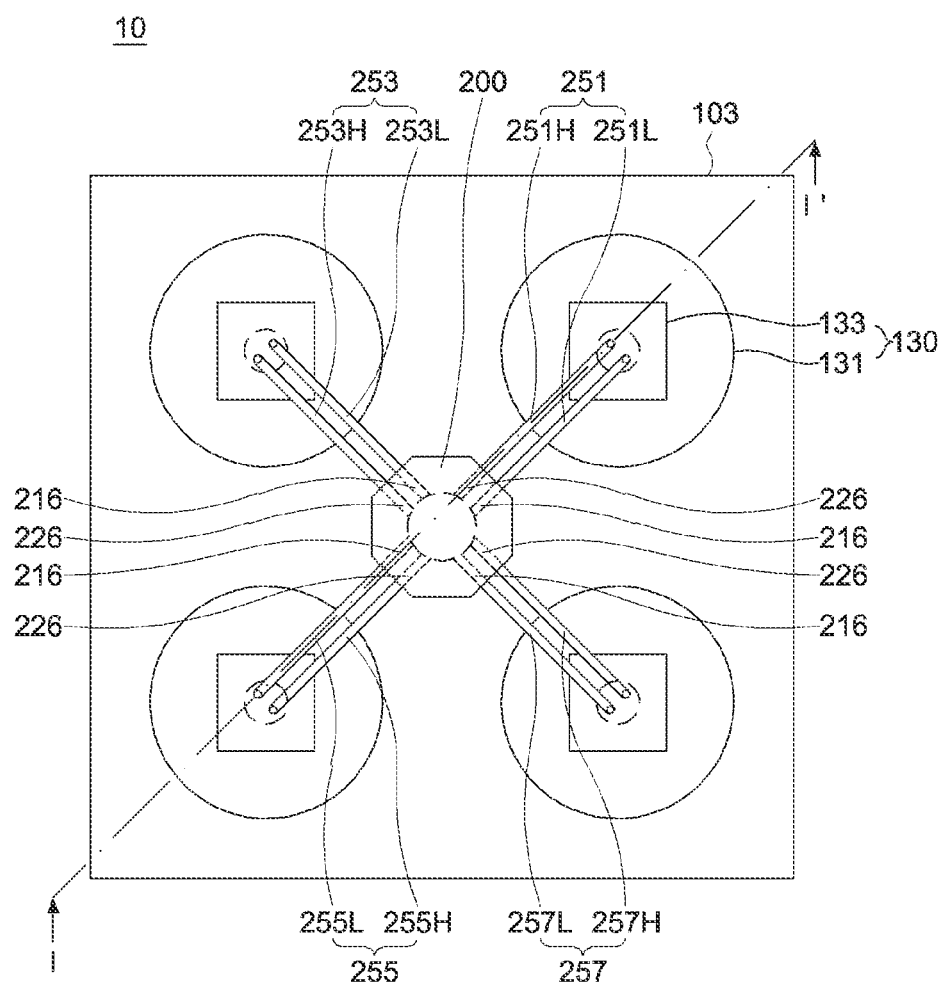
FIG. 1 is a plan view illustrating a substrate-processing apparatus including a gas supply block in accordance with example embodiments.
Figure 2:
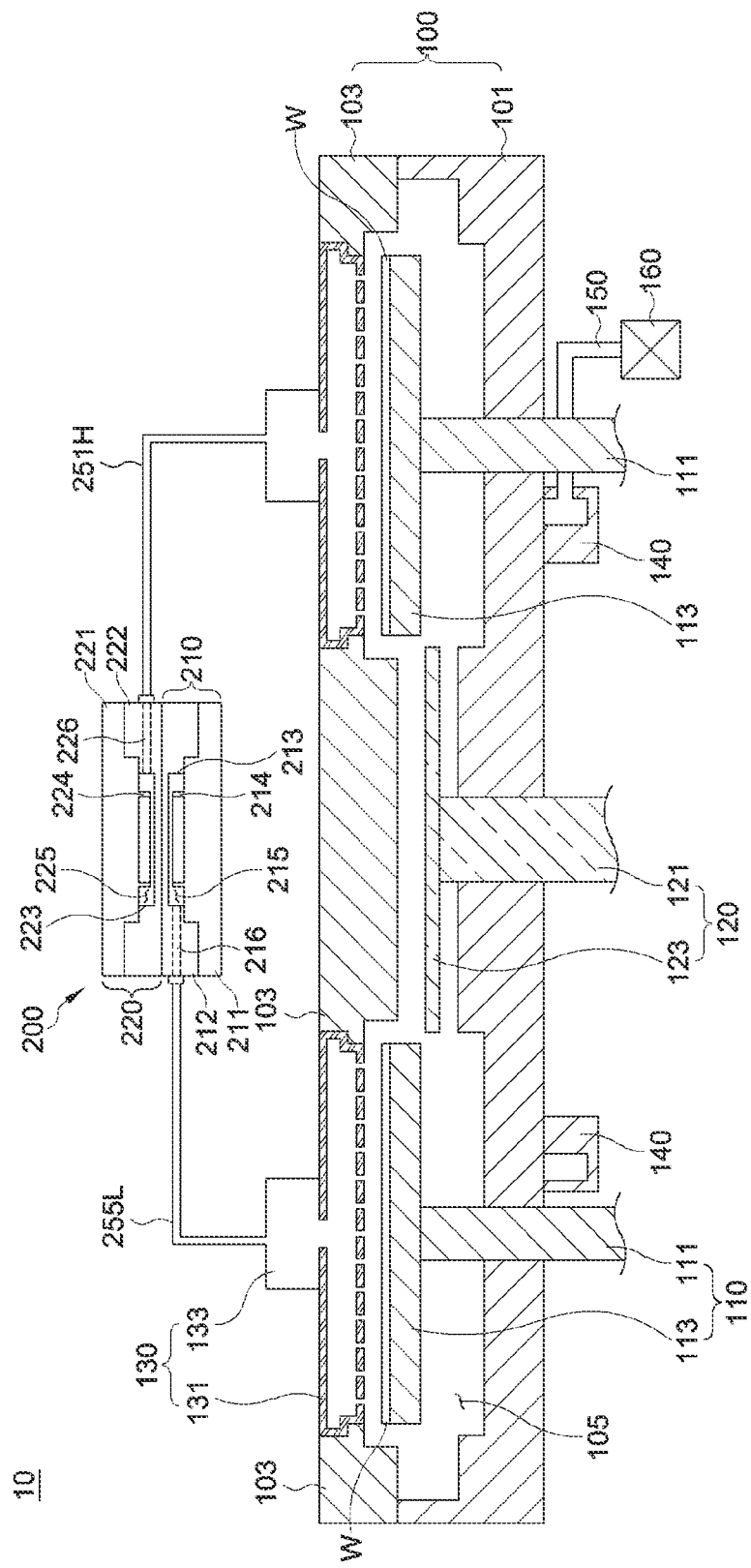
FIG. 2 is a cross-sectional view taken along a line I-I' in FIG. 1.

FIG. 1 is a plan view illustrating a substrate-processing apparatus including a gas supply block in accordance with example embodiments and FIG. 2 is a cross-sectional view taken along a line I-I' in FIG. 1.

Referring to FIGS. 1 and 2, a substrate-processing apparatus 10 of example embodiments may include a chamber 100, a substrate support 110, a gas injector 130 and a gas supply block 200. The chamber 100 may have a processing space. The substrate support 110 may be arranged in the chamber 100 to support a substrate W. The gas injector 130 may be arranged facing the substrate support 110 to inject a process gas to the substrate support 110. The gas supply block 200 may be arranged over the chamber 100 to supply the process gas to the gas injector 130. The substrate-processing apparatus 10 may further include a substrate transfer 120 arranged outside the substrate support 110 to assist a transfer of the substrate W.

The chamber 100 may include a body 101 having an opened upper surface and a top lid 103 installed at the upper surface of the body 101 to open and close the upper surface of the body 101.

A receiving groove 105 may be formed in the body 101 to receive the substrate support 110. The receiving groove 105 may have a shape corresponding to a shape of a supporting plate 113. For example, the receiving groove 105 may have a circular shape. Further, the receiving groove 105 may have a depth. For example, the depth of the receiving groove 105 may correspond to movement ranges in upward and downward directions of the supporting plate 113. This configuration may reduce a size of an inner space of the chamber 100 to decrease an amount of the process gas supplied to the chamber 100 and a time for purging the chamber 100.

A hole may be formed through the receiving groove 105. A supporting shaft 111 of the substrate support 110 may be inserted into the hole. Further, as shown in FIG. 1, when the chamber 100 may process the four substrates W, the four receiving grooves 105 may also be formed.

The four receiving grooves 105 may be connected with each other through exhaust passages. The exhaust passages may be horizontally formed along a bottom surface of the body 101. The exhaust passages may be connected to an exhaust port 140 vertically formed through the bottom surface of the body 101. The exhaust passages may be connected with an exhaust line 150 connected to a vacuum pump 160.

A hole may be formed through the bottom surface of the body 101. A rotation shaft 121 of the substrate transfer 120 may be inserted into the hole. For example, the hole may be formed through a central portion of the bottom surface of the body 101.

Although not depicted in FIGS. 1 and 2, a gate may be formed at a side surface of the body 101. The substrate W may be loaded/unloaded into/from the chamber 100 through the gate.

The top lid 103 may be combined with the body 101 to close the body 101. The top lid 103 may have a size for covering the whole upper surface of the body 101. Alternatively, as shown in FIG. 2, the top lid 103 may be combined with the gas injector 130 to partially cover the upper surface of the body 101.

In example embodiments, in order to readily assemble and disassemble the gas injector, a hole may be vertically formed through the top lid 103. The gas injector 130 may be inserted into the hole from an upper region of the top lid 103, not limited thereto.

The substrate support 110 may be configured to support the substrate W. The substrate support 110 may be arranged in a lower region of the chamber 100. The substrate support 110 may include the supporting plate 113 and the supporting shaft 111. The substrate W may be placed on the supporting plate 113. The supporting shaft 111 may be connected to a lower surface of the supporting plate 113 to lift the supporting plate 113.

Referring to FIG. 2, the supporting plate 113 may have a plate shape having a thickness. The supporting plate 113 may have a shape corresponding to a shape of the substrate W. For example, when the substrate W may include a circular wafer, the supporting plate 113 may have a circular shape, not limited thereto.

The supporting plate 113 may be substantially parallel to the bottom surface of the body 101. The supporting shaft 111 may be substantially perpendicular to the bottom surface of the body 101. The supporting shaft 111 may be connected with a driver such as a motor through a hole formed through the bottom surface of the body 101 to lift the supporting plate 113. A bellows may be installed between the supporting shaft 111 and the hole to seal a space between the supporting shaft 111 and the hole, thereby maintain vacuum in the chamber 100 during processing the substrate W.

Although not depicted in FIG. 2, a heater for heating the supporting plate 113 may be installed in the supporting plate 113. The heater may be connected to a power source through a cable. When a power may be applied to the heater, the heater may heat the supporting plate 113 to heat the substrate W on the supporting plate 113.

The supporting plate 113 may function as a lower electrode as well as the support. Thus, an electric field may be generated between the supporting plate 113 and the gas injector 130. For example, an RF power and a ground power may be applied to the gas injector 130 and the supporting plate 113, respectively, to generate the electric field between the gas injector 130 and the supporting plate 113, thereby forming plasma in the chamber 100. Thus, a ground electrode may be installed in the supporting plate 113.

A plurality of the substrate supports 110 may be arranged in the chamber 100. For example, the four substrate supports 110 may be placed in the chamber 100. The substrate supports 110 may be arranged in a point symmetrical shape with respect to a center of the chamber 100. Alternatively, the substrate support 110 may be one, two, three or no less than five.

When the substrate supports 110 may be arranged in the chamber 100, the substrate transfer 120 may move the substrate W between the substrate supports 110. The substrate transfer 120 may include a rotation shaft 121 and a turn table 123. The rotation shaft 121 may be inserted into a hole formed through the bottom surface of the body 101. The turn table 123 may be horizontally installed at an upper end of the rotation shaft 121.

The rotation shaft 121 may be arranged at a center of the supporting shafts 111 in the substrate supports 110. The rotation shaft 121 may be connected to an actuator such as a motor to rotate and lift the turn table 123. A bellows may be installed between the rotation shaft 121 and the hole to seal a space between the rotation shaft 121 and the hole, thereby maintain the vacuum in the chamber 100.

The turn table 123 may have a plate shape having a thickness. The turn table 123 may be rotated together with the substrate W on the supporting plate 113 to change positions of the substrate W.

The gas injector 130 may face the supporting plate 113 in the chamber 100. The gas injector 130 may be spaced apart from the supporting plate 113. The gas injector 130 may inject the process gas to the supporting plate 113. The gas injector 130 may be connected to a power source to function as an upper electrode for generating the plasma. For example, an RF power may be applied to the gas injector 130 and the supporting plate 113 may be grounded to generate the plasma in the chamber 100. Alternatively, the gas injector 130 may generate the plasma from the process gas. The gas injector 130 may then inject the plasma into the chamber 100. Further, the plasma may be generated outside the chamber 100. The plasma may then be supplied into the chamber 100.

The gas injector 130 may form the upper surface of the chamber 100 together with the top lid 103. The gas injector 130 may be connected to a single gas source for supplying a same kind of the process gas or a plurality of gas sources for supplying different kinds of the process gases. The gas injector 130 may include a showerhead having a plurality of injection holes, not limited thereto.

As shown in FIG. 1, the gas injector 130 may include a plurality of injectors. For example, the four gas injectors 130 may be installed at the top lid 103. The gas injectors 130 may be arranged in a point symmetrical shape with respect to a center of the top lid 103. Alternatively, numbers of the gas injector 130 may be no more than three or no less than five.

Referring to FIGS. 1 and 2, the gas injector 130 may include a gas injection block 131 and a gas inlet block 133. The gas inlet block 133 may be configured to connect the gas injection block 131 with gas supply lines 251, 253, 255 and 257.

For example, the gas injection block 131 may have a first surface and a second surface. The first surface may be adjacent to the supporting plate 113. The gas inlet block 133 may be installed at the second surface. A plurality of injection holes for injecting the process gas may be formed through the first surface of the gas injection block 131. A hole may be formed through the second surface of the gas injection block 131. The process gas supplied into the gas inlet block 133 may pass through the hole. The gas injection block 131 may have a shape in FIG. 2, not limited thereto.

Referring to FIGS. 1 and 2, the gas supply block 200 may be installed at the upper surface of the chamber 100. The gas supply block 200 may be spaced apart from the top lid 103. The gas supply block 200 may supply the process gas to the gas injector 130 through the gas supply lines 251, 253, 255 and 257.

The gas supply block 200 may include a lower block 210 and an upper block 220. The lower block 210 and the upper block 220 may have substantially the same shape, not limited thereto. In example embodiments, different kinds of the process gases may be supplied to the lower block 210 and the upper block 220, respectively, not limited thereto.

Figure 3:
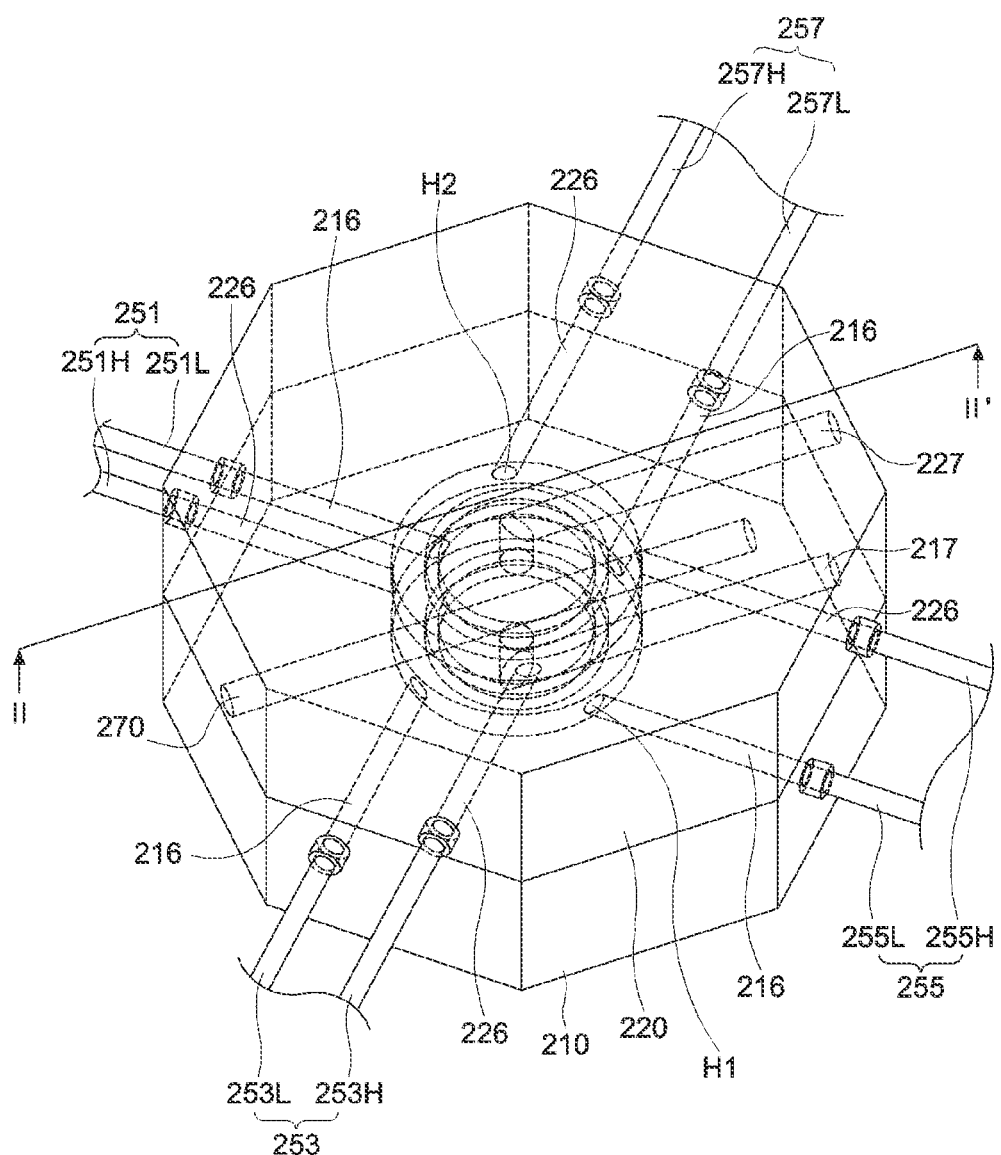
FIG. 3 is a perspective view illustrating a gas supply block in accordance with example embodiments.
Figure 4:
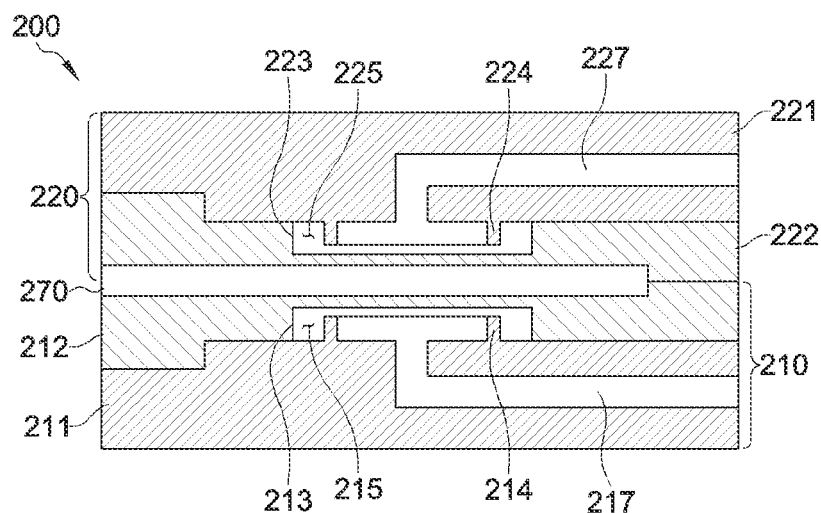
FIG. 4 is a cross-sectional view taken along a line II-II' in FIG. 3.
Figure 5:
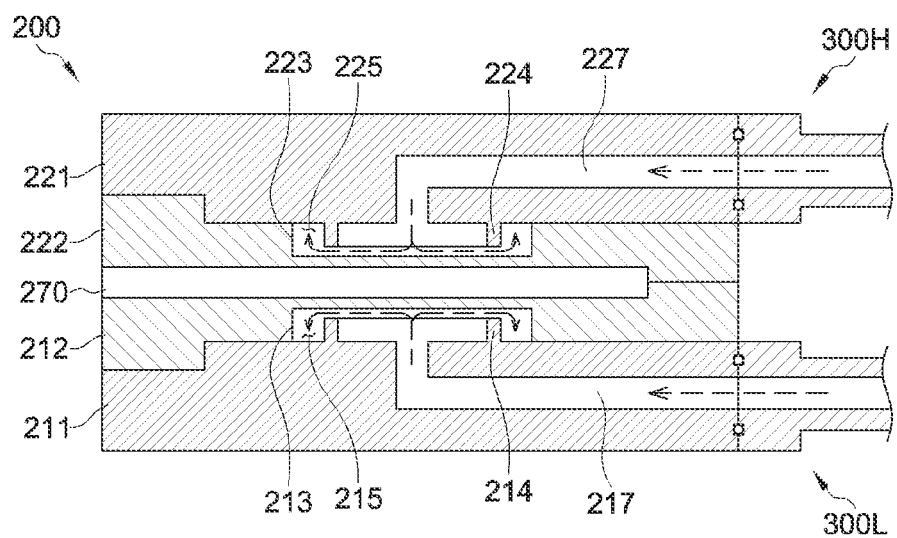
FIG. 5 is a view illustrating a direction of a gas flow in a gas supply block in accordance with example embodiments.

FIG. 3 is a perspective view illustrating a gas supply block in accordance with example embodiments, FIG. 4 is a cross-sectional view taken along a line II-II' in FIG. 3 and FIG. 5 is a view illustrating a direction of a gas flow in a gas supply block in accordance with example embodiments.

The lower block 210 of the gas supply block 200 may include a first block 211 and a second block 212 combined with an upper surface of the first block 211. A partition 214 may be formed on the upper surface of the first block 211. The partition 214 may be vertically extended from the upper surface of the first block 211. For example, the partition 214 may have a ring shape, not limited thereto. When the process gas supplied from first and second gas inlet passages 217 and 227 may be distributed into first and second gas supply passages 216 and 226, the process gas may not be uniformly distributed into the first and second gas supply passages 216 and 226. For example, the process gas may be relatively biased toward any one of the first and second gas supply passages 216 and 226. However, the partition 214 may function as to diffuse the process gas in an inner space of the partition 214 to uniformly distribute the process gas into the first and second gas supply passages 216 and 226.

An inserting groove 213 corresponding to the partition 214 may be formed at a lower surface of the second block 212. The inserting groove 213 may have a depth greater than a height of the partition 214 and a diameter greater than a diameter of the partition 214. Thus, a diffusing space 215 in which the process gas may diffuse may be formed between the inner surface of the inserting groove 213 and an outer surface of the partition 214.

Referring to FIG. 3, a plurality of lower exhaust grooves H1 may be formed through a sidewall of the inserting groove 213. The process gas may be exhausted through the lower exhaust grooves H1. The lower exhaust grooves H1 may be connected to the first gas supply passages 216. The first gas supply passages 216 may be formed from the sidewall of the inserting groove 213 to the sidewall of the second block 212. Each of the first gas supply passages 216 may be connected to a gas supply line.

An inlet hole may be formed through a bottom surface of the annular partition 214 of the first block 211. The process gas may pass through the inlet hole. The inlet hole may be connected to the first gas inlet passage 217. The first gas inlet passage 217 may be connected to a gas supply pipe 300L in FIG. 5 connected with a gas source.

Referring to FIG. 5, the process gas in the gas supply pipe 300L from the gas source may be introduced into the inner space of the partition 214 through the inlet hole at the bottom surface of the partition 214. The process gas in the inner space of the partition 214 may diffuse through a gap between an upper end of the partition 214 and the bottom surface of the inserting groove 213. The process gas diffusing into the diffusing space may be supplied to gas supply lines 251L, 253L, 255L, and 257L, through the lower exhaust grooves H1 and the first gas supply passages 216. The process gas supplied to the gas supply lines 251L, 253L, 255L and 257L may then be supplied to the gas injector 130.

The upper block 220 of the gas supply block 200 may include a third block 221 and a fourth block 222 combined with an upper surface of the third block 221. A partition 224 may be formed on the upper surface of the third block 221. The partition 224 may be vertically extended from the upper surface of the third block 221. For example, the partition 224 may have a ring shape, not limited thereto.

An inserting groove 223 corresponding to the partition 224 may be formed at an upper surface of the fourth block 222. The inserting groove 223 may have a depth greater than a height of the partition 224 and a diameter greater than a diameter of the partition 224. Thus, a diffusing space 225 in which the process gas may diffuse may be formed between the inner surface of the inserting groove 223 and an outer surface of the partition 224.

Referring to FIG. 3, a plurality of upper exhaust grooves H2 may be formed through a sidewall of the inserting groove 223. The process gas may be exhausted through the upper exhaust grooves H2. The upper exhaust grooves H2 may be connected to the second gas supply passages 226. The second gas supply passages 226 may be formed from the sidewall of the inserting groove 223 to the sidewall of the fourth block 222. Each of the second gas supply passages 226 may be connected to a gas supply line.

An inlet hole may be formed through a bottom surface of the annular partition 224 of the third block 221. The process gas may pass through the inlet hole. The inlet hole may be connected to the second gas inlet passage 227. The second gas inlet passage 227 may be connected to a gas supply pipe 300H in FIG. 5 connected with a gas source.

Referring to FIG. 5, the process gas in the gas supply pipe 300H from the gas source may be introduced into the inner space of the partition 224 through the inlet hole at the bottom surface of the partition 224 along the second gas inlet passage 227 at the third block 221. The process gas in the inner space of the partition 224 may diffuse through a gap between an upper end of the partition 224 and the bottom surface of the inserting groove 223. The process gas diffusing into the diffusing space may be supplied to gas supply lines 251H, 253H, 255H and 257H through the upper exhaust grooves H2 and the second gas supply passages 226. The process gas supplied to the gas supply lines 251H, 253H, 255H and 257H may then be supplied to the gas injector 130.

As shown in FIG. 3, the first gas supply passages 216 of the lower block 210 in the gas supply block 200 may be spaced apart from each other by a uniform gap. The second gas supply passages 226 of the upper block 220 may also be spaced apart from each other by a uniform gap. Thus, the first and second process gases may be uniformly distributed into the gas injectors 130 by the uniform gap between the first and second gas supply passages 216 and 226.

The first gas supply passage 216 of the lower block 210 and the second gas supply passage 226 of the upper block 220 may be shifted from each other, not be vertically aligned with each other. Thus, the gas supply lines 251L, 253L, 255L and 257L connected to the first gas supply passage 216 of the lower block 210 and the gas supply lines 251H, 253H, 255H and 257H connected to the second gas supply passage 226 of the upper block 220 may be combined with the gas injectors 130 without interference.

The first gas supply passage 216 of the lower block 210 may be formed in the second block 212. The first gas supply passage 216 may have a straight shape inclined to a line passing a center point of the inserting groove 213. The second gas supply passage 226 of the upper block 220 may be formed in the fourth block 222. The second gas supply passage 226 may have a straight shape inclined to a line passing a center point of the inserting groove 223.

When the first and second gas supply passages 216 and 226 may be positioned on the lines passing the center points of the inserting grooves 213 and 223, the process gas introduced from the first and second gas inlet passages 217 and 227 may be directly exhausted through the first and second gas supply passages 216 and 226, not sufficiently diffuse, such that the process gas may be biased toward any one of the supply passages. According to example embodiments, because the first and second gas supply passages 216 and 226 may be inclined to the lines passing the center points of the inserting grooves 213 and 223, an internal current such as tornado may be generated in the diffusing spaces 215 and 225 so that the process gas introduced from the first and second gas inlet passages 217 and 227 may sufficiently diffuse. As a result, the process gas may then be uniformly distributed into the first and second gas supply passages 216 and 226.

Further, the gas supply block 200 may include a heater 270 in the gas supply block 200. For example, the heater 270 may be arranged between the lower block 210 and the upper block 220. The heater 270 may be connected with a power source through a cable. When the power may be applied to the heater 270, a temperature of the process gas supplied to the lower block 210 and the upper block 220 may be maintained by the heater 270.

Although not depicted in drawings, the substrate-processing apparatus 10 may further include a controller. The controller may control operations of the supporting shaft 111, the rotation shaft 121, the gas injector 130, the power source, etc.

Figure 6:
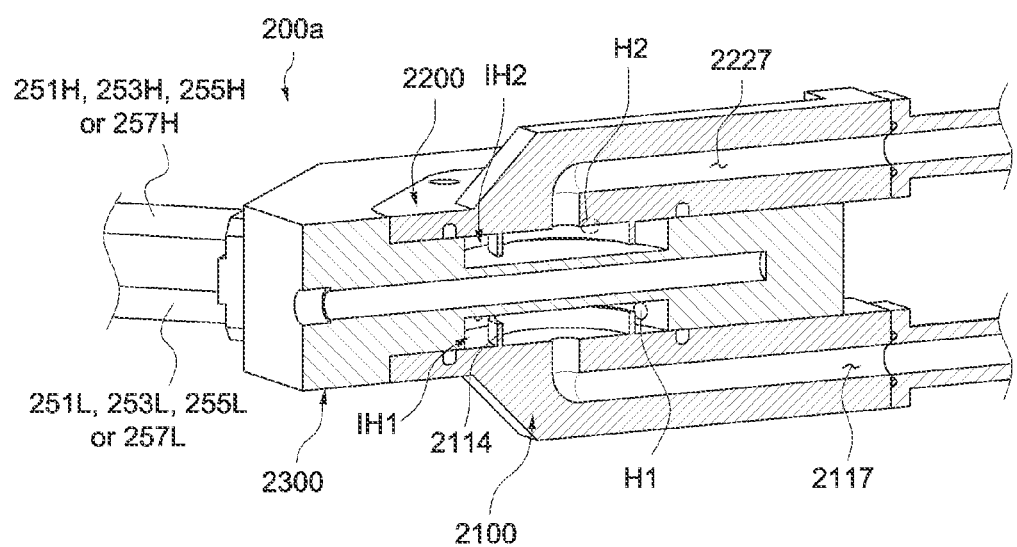
FIG. 6 is a perspective view illustrating a gas supply block in accordance with example embodiments.
Figure 7:
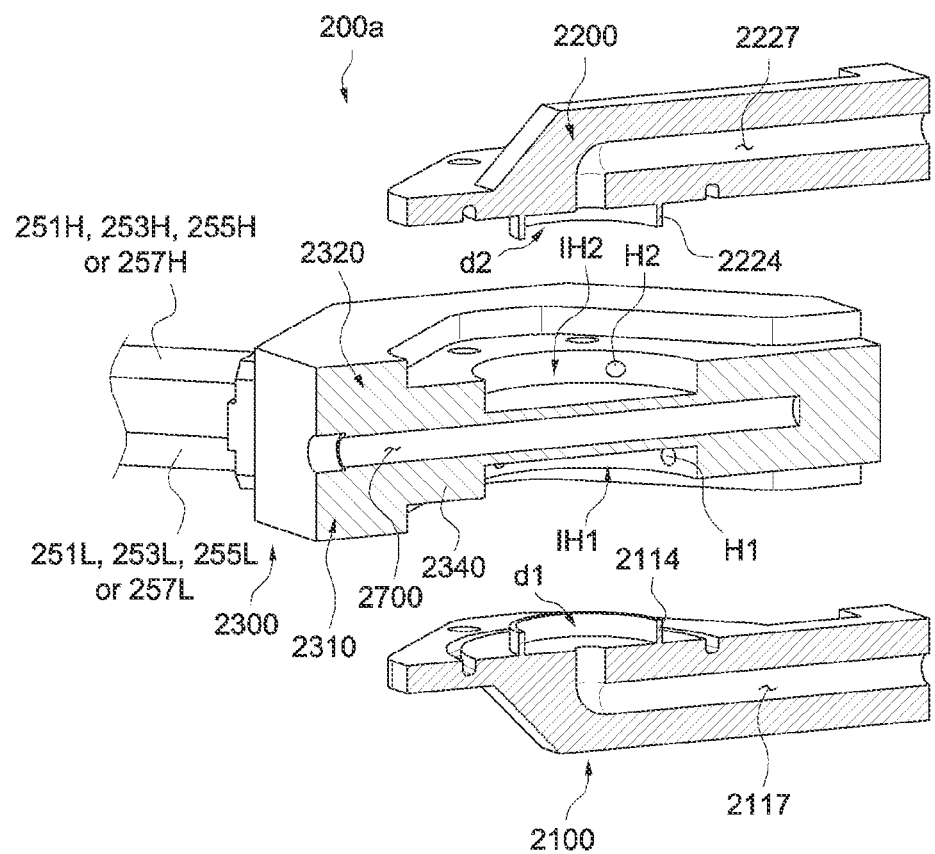
FIG. 7 is an exploded perspective view illustrating a gas supply block in accordance with example embodiments.

FIG. 6 is a perspective view illustrating a gas supply block in accordance with example embodiments and FIG. 7 is an exploded perspective view illustrating a gas supply block in accordance with example embodiments.

Referring to FIGS. 6 and 7, a gas supply block 200a may include a first block 2100; a second block 2200 and a third block 2300.

The first block 2100 may include a first gas inlet passage 2117. The first gas inlet passage 2117 may be connected to a first gas source to supply a first process gas to a first space d1 formed at an upper surface of the first block 2100 corresponding to a facing surface of the third block 2300. Because FIGS. 6 and 7 may the perspective views representing a cross-sectional structure of the gas supply block 200a, although the first space d1 in FIGS. 6 and 7 may be depicted as a semi-circular shape, the first space d1 may actually have a circular shape, i.e., a ring shape. The first space d1 may be defined by a first partition 2114 at the upper surface of the first block 2100. The first partition 2114 may have a height from the upper surface of the first block 2100. The first partition 2114 may be protruded toward the upper surface of the first block 2100.

The second block 2200 may be positioned over the first block 2100. The second block 2200 may have a shape formed by rotating the first block 2100 at an angle of about 180°. The second block 2200 may include a second gas inlet passage 2217. The second gas inlet passage 2217 may be connected to a second gas source to supply a second process gas to a second space d2. The second space d2 may be defined by a second partition 2224 corresponding to the first space d1. The second partition 2224 may have a height substantially the same as the height of the first partition 2114. The second partition 2224 may be protruded toward a lower upper surface of the second block 2200.

The third block 2300 may be arranged between the first block 2100 and the second block 2200 to combine the first block 2100 with the second block 2200. The third block 2300 may have a lower region 2310 facing the first block 2100 and an upper region 2320 facing the second block 2200. A first gas receiving space may be formed at a surface of the lower region 2310 facing the first block 2100. Thus, when the lower region 2310 may be combined with the first block 2100, a first inserting groove IH1 may be formed in the gas supply block 200a. The first inserting groove IH1 may have a size configured to receive the first space d1. For example, the first inserting groove IH1 may have a depth greater than the height of the first partition 2114. Thus, an upper end of the first partition 2114 may not make contact with the first inserting groove IH1. That is, the height of the first partition 2114 may be less than the depth of the first inserting groove IH1. Therefore, a movement passage may be formed in the first inserting grooves IH1 at both sides of the first partition 2114 so that the process gas may uniformly diffuse in the movement passage. Further, at least one lower exhaust groove H1 may be formed at a sidewall of the first inserting groove IH1. The lower exhaust groove H1 may be connected to gas supply lines 300L. The lower exhaust grooves H1 may be spaced apart from each other by a uniform gap. The lower exhaust grooves H1 may be combined with the gas supply lines 251L, 253L, 255L and 257L in FIG. 3 to supply the process gas to the gas injectors 130.

A first gas receiving space may be formed at a surface of the upper region 2320 facing the second block 2200. Thus, when the upper region 2320 may be combined with the second block 2200, a second inserting groove IH2 may be formed in the gas supply block 200a. The second inserting groove IH2 may have a size configured to receive the second space d2. For example, the second inserting groove IH2 may have a depth greater than the height of the second partition 2224. Thus, an upper end of the second partition 2224 may not make contact with the second inserting groove IH2. Therefore, the process gas may easily flow through a space between the second partition 2224 and the second inserting groove IH2 so that the process gas may uniformly diffuse in the second inserting grooves IH2 at both sides of the second partition 2224. Further, at least one upper exhaust groove H2 may be formed at a sidewall of the second inserting groove IH2. The upper exhaust grooves H2 may be spaced apart from each other by a uniform gap. The upper exhaust grooves H2 may be combined with the gas supply lines 251L, 253L, 255L and 257L in FIG. 3 to supply the process gas to the gas injectors 130.

A heater 2700 may be arranged in the third block 2300, The heater 2700 may be extended through a space between the first inserting groove IH1 and the second inserting groove IH2. In example embodiments, the heater 2700 may include a cartridge type heater having a bar shape. For example, the heater 2700 may include a conductive material having high heat dissipation. The heater 2700 may maintain temperatures of the first and second blocks 2100 and 2200 as well as temperatures of the lower region 2310 and the upper region 2320 of the third block 2300.

The first process gas supplied from the first gas inlet passage 2117 may uniformly diffuse in the first inserting groove IH1 defined by the first partition 2114. The first process gas may be uniformly supplied to the gas injectors 130 through the gas supply lines 251L, 253L, 255L and 257L connected to the lower exhaust grooves H1 formed at the sidewall of the first inserting groove IH1.

The second process gas supplied from the second gas inlet passage 2227 may uniformly diffuse in the second inserting groove IH2 defined by the second partition 2224. The second process gas may be uniformly supplied to the gas injectors 130 through the gas supply lines 251L, 253L, 255L and 257L connected to the upper exhaust grooves H2 formed at the sidewall of the second inserting groove IH2.

The above described embodiments of the present invention are intended to illustrate and not to limit the present invention. Various alternatives and equivalents are possible. The invention is not limited by the embodiments described herein. Nor is the invention limited to any specific type of semiconductor device. Another additions, subtractions, or modifications are obvious in view of the present disclosure and are intended to fall within the scope of the appended claims.

What is claimed is:

1. A gas supply block comprising:
  a lower block including a plurality of first gas supply passages configured to distribute and supply a first process gas into a plurality of processing spaces and a first gas inlet passage configured to introduce the first process gas into the plurality of first gas supply passages;
  wherein the lower block comprises a first block and a second block, the first gas inlet passage is formed in the first block, a first partition extends from the first block, an inner space of the first partition is open to the first gas inlet passage and a first inserting groove within the second block, and the first process gas in the inner space of the first partition diffuses through a gap between the first partition and a surface of the second block;
  an upper block including a plurality of second gas supply passages configured to distribute and supply a second process gas different from the first process gas into the plurality of processing spaces and a second gas inlet passage configured to supply the second process gas into the plurality of second gas supply passages; and
  wherein the upper block comprises a third block and a fourth block, the second gas inlet passage is formed in the third block, a second partition extends from the third block, an inner space of the second partition is open to the second gas inlet passage and a second inserting groove within the fourth block, and the second process gas in the inner space of the second partition diffuses through a gap between the second partition and a surface of the fourth block.

2. The gas supply block of claim 1, wherein the first partition is annular, and the second partition is annular.

3. The gas supply block of claim 1, wherein the first partition has a height and a diameter less than a height and a diameter of the first inserting groove and the second partition has a height and a diameter less than a height and a diameter of the second inserting groove.

4. The gas supply block of claim 1, wherein the plurality of first gas supply passages are formed between the first inserting groove and a sidewall of the second block and are spaced apart by a uniform gap, and the plurality of second gas supply passages are formed between the second inserting groove and a sidewall of the fourth block and are spaced apart by a uniform gap.

5. The gas supply block of claim 1, wherein the plurality of second gas supply passages are shifted from the plurality of first gas supply passages such that the plurality of first gas supply passages is not vertically aligned with the plurality of second gas supply passages.

6. The gas supply block of claim 1, wherein the plurality of first gas supply passages are shifted with respect to a line passing through a center point of the first inserting groove such that the plurality of first gas supply passages are not vertically aligned with the line and the plurality of second gas supply passages are shifted with respect to a line passing through a center point of the second inserting groove such that the plurality of second gas supply passages are not vertically aligned with the line.

7. The gas supply block of claim 1, wherein the first inserting groove is disposed between a first surface of the second block and the first partition, and the second inserting groove is disposed between a second surface of the fourth block and the second partition.

8. The gas supply block of claim 1, wherein the first process gas introduced through the first gas inlet passage is supplied into the inner space of the first partition, and the first process gas in the inner space of the first partition diffuses into a diffusing space through a gap between an end of the first partition and an inner surface of the second block.

9. The gas supply block of claim 1, wherein the second process gas introduced through the second gas inlet passage is supplied into the inner space of the second partition, and the second process gas in the inner space of the second partition diffuses into a diffusing space through a gap between an end of the second partition and an inner surface of the fourth block.

10. The gas supply block of claim 1, further comprising a heater arranged between the lower block and the upper block to heat the first process gas and the second process gas.

11. A gas supply block comprising:
a first block including a first gas inlet passage configured to supply a first process gas;
wherein a first partition extends from the first block, an inner space of the first partition is connected to the first gas inlet passage and a first inserting groove, and the first process gas in the inner space of the first partition diffuses into the first inserting groove;
a second block including a second gas inlet passage configured to supply a second process gas; and
wherein a second partition extends from the second block, an inner space of the second partition is connected to the second gas inlet passage and a second inserting groove, and the second process gas in the inner space of the second partition diffuses into the second inserting groove;
a third block configured to distribute and supply the first process gas and the second process gas into a plurality of processing spaces.

12. The gas supply block of claim 11, wherein the first partition is annular, and the second partition is annular.

13. The gas supply block of claim 11, wherein the first inserting groove is disposed between a first surface of the third block and the first partition, and the second inserting groove is disposed between a second surface of the third block and the second partition.

14. The gas supply block of claim 11, wherein the first inserting groove has a depth greater than a height of the first partition to form a gas movement passage between an end of the first partition and a first surface of the third block, thereby uniformly diffusing the first process gas in the first inserting groove, wherein the first surface is adjacent to the first inserting groove.

15. The gas supply block of claim 11, wherein at least one first exhaust groove is formed adjacent to the first inserting groove and the first process gas is supplied to a first processing space of the plurality of processing spaces by connecting the first processing space with one of the first exhaust groove and a gas supply line.

16. The gas supply block of claim 11, wherein the second inserting groove has a depth greater than a height of the second partition to form a gas movement passage between an end of the second partition and a second surface of the third block, thereby uniformly diffusing the second process gas in the second inserting groove, wherein the second surface is adjacent to the second inserting groove.

17. The gas supply block of claim 11, wherein at least one second exhaust groove is formed adjacent to the second inserting groove and the second process gas is supplied to a second processing space of the plurality of processing spaces by connecting the second processing space with one of the second exhaust groove and a gas supply line.

18. The gas supply block of claim 11, further comprising a heater arranged between the first inserting groove and the second inserting groove of the third block to heat the first process gas and the second process gas.

19. A substrate-processing apparatus comprising:
a chamber including a plurality of processing spaces;
a plurality of substrate supports arranged in the processing spaces;
a plurality of gas injectors arranged corresponding to the substrate supports; and
a gas supply block configured to supply a process gas into the chamber including the plurality of processing spaces, the gas supply block comprising:
a lower block including a plurality of first gas supply passages configured to distribute and supply a first process gas into the processing spaces and a first gas inlet passage configured to introduce the first process gas into the plurality of first gas supply passages, wherein the lower block comprises a first partition and a first inserting groove corresponding to the first partition, wherein the first partition has a height and a diameter less than a height and a diameter of the first inserting groove; and
an upper block including a plurality of second gas supply passages configured to distribute and supply a second process gas different from the first process gas into the processing spaces and a second gas inlet passage configured to supply the second process gas into the plurality of second gas supply passages, wherein the upper block comprises a second partition and a second inserting groove corresponding to the second partition, wherein the second partition has a height and a diameter less than a height and a diameter of the second inserting groove;
wherein the gas supply block is configured to supply the first process gas and the second process gas to the plurality of gas injectors; and
wherein the gas supply block alternately supplies the first process gas and the second process gas to the plurality of gas injectors.

20. The substrate-processing apparatus of claim 19, wherein the first partition is annular, and the second partition is annular.

21. The substrate-processing apparatus of claim 19, wherein the plurality of first gas supply passages are formed between the first inserting groove and a sidewall of the lower block and are spaced apart by a uniform gap, and the plurality of second gas supply passages are formed between the second inserting groove and a sidewall of the upper block and are spaced apart by a uniform gap.

22. The substrate-processing apparatus of claim 19, wherein the plurality of second gas supply passages are offset from the plurality of first gas supply passages such that the plurality of first gas supply passages is not vertically aligned with the plurality of second gas supply passages.

23. The substrate-processing apparatus of claim 19, wherein the plurality of first gas supply passages are offset with respect to a line passing through a center point of the first inserting groove such that the plurality of first gas supply passages are not vertically aligned with the line and the plurality of second gas supply passages are offset with respect to a line passing through a center point of the second inserting groove such that the plurality of second gas supply passages are not vertically aligned with the line.

24. The substrate-processing apparatus of claim 19, wherein the first inserting groove is disposed between a first surface of the lower block and the first partition, and the second inserting groove is disposed between a second surface of the upper block and the second partition.

25. The substrate-processing apparatus of claim 19, wherein the first process gas introduced through the first gas inlet passage is supplied into the inner space of the first partition, and the first process gas in the inner space of the first partition diffuses into a diffusing space through a gap between an end of the first partition and an inner surface of the lower block.

26. The substrate-processing apparatus of claim 19, wherein the second process gas introduced through the second gas inlet passage is supplied into the inner space of the second partition, and the second process gas in the inner space of the second partition diffuses into a diffusing space through a gap between an end of the second partition and an inner surface of the upper block.

27. The substrate-processing apparatus of claim 19, further comprising a heater arranged between the lower block and the upper block to heat the first process gas and the second process gas.

* * * * *